(12) United States Patent
Kasahara

(10) Patent No.: US 8,324,627 B2
(45) Date of Patent: Dec. 4, 2012

(54) ORGANIC THIN FILM TRANSISTOR SUBSTRATE, ITS MANUFACTURING METHOD, IMAGE DISPLAY PANEL, AND ITS MANUFACTURING METHOD

(75) Inventor: Kenji Kasahara, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/221,068

(22) Filed: Aug. 30, 2011

(65) Prior Publication Data
US 2011/0309366 A1    Dec. 22, 2011

Related U.S. Application Data

(62) Division of application No. 12/532,976, filed as application No. PCT/JP2008/055570 on Mar. 25, 2008, now Pat. No. 8,030,125.

(30) Foreign Application Priority Data

Mar. 27, 2007    (JP) .................. 2007-082278

(51) Int. Cl.
*H01L 51/10*    (2006.01)

(52) U.S. Cl. .................... 257/59; 257/E51.006; 257/40; 257/759

(58) Field of Classification Search .................... 257/59, 257/E51.006, 40, 759
See application file for complete search history.

(56) References Cited

U.S. PATENT DOCUMENTS

| 6,380,672 B1 | 4/2002 | Yudasaka |
| 7,518,140 B2 | 4/2009 | Suh et al. |

(Continued)

FOREIGN PATENT DOCUMENTS

| CN | 1710721 A | 12/2005 |
| CN | 1893108 A | 1/2007 |
| JP | 2004-171861 A | 6/2004 |

(Continued)

OTHER PUBLICATIONS

T. Shimoda, et al. "Multicolor Pixel Patterning of Light-Emitting Polymers by Ink-Jet Printing", SID 99 Digest, 1999, pp. 376-379.

*Primary Examiner* — Marc Armand
(74) *Attorney, Agent, or Firm* — Sughrue Mion, PLLC

(57) ABSTRACT

The present invention is a method for manufacturing an organic thin-film transistor substrate including an organic thin-film transistor as a transistor element, and an object of the invention is to provide a manufacturing method capable of forming a bank in a smaller number of steps. The method for manufacturing the organic thin-film transistor substrate of the present invention, in which an organic thin-film transistor is formed in a first region on a substrate, a second region for forming a light-emitting element in abutment with the first region is included, and a bank part is formed in a peripheral part of the second region, is characterized by including: a first step of forming the organic thin-film transistor in the first region on the substrate and forming at least one of the gate insulation layer and the organic semiconductor layer included by this organic thin-film transistor as far as the second region, thereby forming, in the second region, a bank precursor layer composed of a laminated structure formed on the second region; and a second step of removing the regions of the bank precursor layer other than the peripheral part, thereby forming the bank part made of the remaining bank precursor layer.

4 Claims, 8 Drawing Sheets

U.S. PATENT DOCUMENTS

| | | |
|---|---|---|
| 7,875,475 B2 | 1/2011 | Suh et al. |
| 2005/0279999 A1 | 12/2005 | Lee et al. |
| 2006/0060855 A1 | 3/2006 | Lee et al. |
| 2006/0115983 A1 | 6/2006 | Fujii et al. |
| 2006/0220542 A1 | 10/2006 | Suh et al. |
| 2006/0220544 A1 * | 10/2006 | Okuyama et al. ............. 313/506 |
| 2007/0007515 A1 | 1/2007 | Suh et al. |
| 2007/0007527 A1 * | 1/2007 | Koyama ........................ 257/59 |

FOREIGN PATENT DOCUMENTS

| | | |
|---|---|---|
| JP | 2006-005329 A | 1/2006 |
| JP | 2006-093652 A | 4/2006 |
| JP | 2006-186332 A | 7/2006 |
| JP | 2006-294484 A | 10/2006 |
| JP | 2006-310289 A | 11/2006 |
| WO | 99/10862 A | 3/1999 |

* cited by examiner

ORGANIC THIN FILM TRANSISTOR SUBSTRATE, ITS MANUFACTURING METHOD, IMAGE DISPLAY PANEL, AND ITS MANUFACTURING METHOD

CROSS REFERENCE TO RELATED APPLICATIONS

This application is a Divisional of U.S. application Ser. No. 12/532,976 filed Nov. 17, 2009 which is a National Stage of International Application No. PCT/JP2008/055570 filed Mar. 25, 2008, claiming priority based on Japanese Patent Application No. 2007-082278, filed Mar. 27, 2007, the contents of all of which are incorporated herein by reference in their entirety.

TECHNICAL FIELD

The present invention relates to an organic thin-film transistor substrate, its manufacturing method, an image display panel, and its manufacturing method.

BACKGROUND ART

An image display panel used as a display generally has a construction in which a multitude of unit pixels, including light-emitting elements and transistor elements, are arranged. In such an image display panel as described above, the light emission of light-emitting elements is controlled by transistor elements in individual pixels and, thereby, an image is displayed.

Conventionally, a thin-film transistor (TFT), in which an inorganic semiconductor thin film made of a-Si (amorphous silicon) or p-Si (polysilicon) is used as a transistor element, has been used commonly in an image display panel. In general, however, an apparatus provided with large-scale vacuum processing equipment and high-temperature processing equipment is required in the manufacture of TFTs that use an inorganic semiconductor thin film. Therefore, the cost of manufacture has tended to be high. Particularly in recent years, an increase in the cost of manufacture has been remarkable since an increase in the screen size of a display is being promoted.

Hence, in recent years, a study has been made of applying a thin-film transistor (organic thin-film transistor) that uses an organic semiconductor thin film to an image display panel in place of the inorganic semiconductor thin film. Since the organic semiconductor thin film can be formed by a relatively low-temperature process, it is possible to simplify the manufacturing steps of the organic thin-film transistor and reduce the cost of manufacture thereof. In addition, since a low-temperature process allows a relatively heat-sensitive resin substrate to be also applicable, it is possible to reduce the weight of the image display panel as a whole. Furthermore, use of a resin substrate having flexibility makes a flexible panel available. Still furthermore, the organic semiconductor thin film can also be manufactured by means of wet coating, such as printing or coating, under the atmospheric pressure. In this case, the image display panel can be manufactured with extremely high productivity and at low costs.

Incidentally, such an image display panel as described above is generally manufactured by forming light-emitting elements after transistor elements are formed. In such a manufacturing method, an insulating layer called a bank is often formed in each pixel in the outer-circumferential part of a region in which a light-emitting element is formed. This bank is provided in order to prevent short-circuiting between electrodes that a light-emitting element has and divide off a light-emitting cell. This bank also functions as a partition for retaining a material solution within a predetermined region when a light-emitting layer made of a high-polymer material is formed using a wet coating method in cases where an organic EL element, for example, is formed as the light-emitting element. Since such a bank is made of a polyimide, a photoresist or the like and remains as a structure of the panel, a selection is made of a bank formed of a material superior in mechanical strength and heat resistance.

As an image display panel including a bank, there is known an active-matrix display unit, for example, in which a conduction control circuit containing a thin-film transistor and a thin-film light-emitting element are included in each pixel, a region in which an organic semiconductor film of a thin-film light-emitting element is to be formed is defined by an insulating film thicker than the organic semiconductor film, and the insulating film is constructed of a lower layer-side insulating film made of an inorganic material and an upper layer-side insulating film made of an organic material (see Patent Document 1).

In such a display unit, the insulating film functions as a bank. In addition, Patent Document 1 describes that the insulating film having the above-described construction can be formed into a thick film without causing damage on the thin-film light-emitting element.

Patent Document 1: International Publication No. 98/10862 pamphlet

DISCLOSURE OF THE INVENTION

Problem to be Solved by the Invention

However, when forming such a bank as described above, there separately arises the need for a step of forming the bank and, therefore, the manufacturing steps of the image display panel become complicated as much. In particular, when forming a bank (insulating film) made of a plurality of layers as in the case of the above-described related art, there is added a step of forming the bank. Consequently, the manufacturing steps tend to become even more complicated. Accordingly, even if an organic thin-film transistor is applied as a transistor element to simplify manufacturing steps and reduce manufacturing costs, it has been sometimes not possible to fully obtain effects of such simplification and reduction due to the step of bank formation. In addition, an organic semiconductor thin film used for the organic thin-film transistor is, in some cases, insufficient in strength and heat resistance when compared with an inorganic semiconductor thin film. Accordingly, also from the viewpoint of suppressing damage on the organic semiconductor thin film, it is preferable that the number of steps required for bank formation is as small as possible.

Hence, the present invention has been accomplished in view of the above-described circumstances. It is therefore an object of the present invention to provide a method for manufacturing an organic thin-film transistor substrate including an organic thin-film transistor as a transistor element, whereby it is possible to form a bank in a smaller number of steps. It is another object of the present invention to provide an organic thin-film transistor substrate obtained by such a manufacturing method, an image display panel that uses such an organic transistor substrate, and a manufacturing method thereof.

Means for Solving the Problem

In order to achieve the aforementioned objects, a method for manufacturing an organic thin-film transistor of the present invention, in which an organic thin-film transistor is formed in a first region on a substrate, a second region for forming a light-emitting element in abutment with this first region is included, and a bank part is formed in a peripheral part of the second region, is characterized by including: a first step of forming, in the first region on the substrate, the organic thin-film transistor provided at least with a gate electrode, a gate insulation layer, a source electrode and a drain electrode formed on a side of this gate insulation layer opposite to the gate electrode, and an organic semiconductor layer formed on a side of the gate insulation layer opposite to the gate electrode and having contact with both the source electrode and the drain electrode, and forming at least one of the gate insulation layer and the organic semiconductor layer as far as the second region, thereby forming, in the second region, a bank precursor layer composed of a laminated structure formed on the second region; and a second step of selectively removing the regions of the bank precursor layer other than the peripheral part, thereby forming the bank part made of the remaining bank precursor layer.

In the above-described manufacturing method of the present invention, there is formed the organic thin-film transistor, the gate insulation layer or the organic semiconductor layer, which is part of the construction of the transistor, is formed as far as the region in which the bank part is formed, and these layers are applied to at least part of the bank part. Consequently, it is possible to skip some or all of the steps used to form the bank part. As a result, it is possible to manufacture the organic thin-film transistor substrate in a simplified manner and reduce the cost of manufacture. Since the gate insulation layer and the organic semiconductor layer in the organic thin-film transistor function as insulators under normal conditions, the bank part which includes these layers can have adequate insulation properties as a partition or the like for a light-emitting region.

In addition, in the above-described method for manufacturing an organic thin-film transistor substrate of the present invention, it is preferable to: in the first step, form the gate electrode in the first region on the substrate; form the gate insulation layer in the first and second regions on the substrate, so as to cover the gate electrode; form the source electrode and the drain electrode on the gate insulation layer of the first region; form the organic semiconductor layer on the gate insulation layer of the first and second regions, so as to cover the source electrode and the drain electrode; and form a mask layer on the organic semiconductor layer in the region including the first region and the peripheral part of the second region; and in the second step, selectively remove the bank precursor layer in regions not covered with the mask layer by performing etching.

According to such a manufacturing method as described above, there is obtained a bottom-gate organic thin-film transistor in which a gate electrode is located on the lower side thereof. In addition, it is possible to form not only such an organic thin-film transistor but also a sufficiently high bank part including a gate insulation layer, an organic semiconductor layer and a mask layer. Since this bank part itself has properties adequate for a bank, according to the above-described manufacturing method, there is no need for any additional steps for bank formation. Consequently, it is possible to further simplify manufacturing steps. It is also possible to precisely form a region for forming a light-emitting element by performing etching using a mask.

In the case of such a manufacturing method as described above, it is preferable to: in the first step, form a lower electrode for the light-emitting element in the second region on the substrate at least prior to forming a gate insulation layer; provide an opening in part of the gate insulation layer after the gate insulation layer is formed; and connect the drain electrode and the lower electrode using the opening during or after the formation of the drain electrode; and in the second step, selectively remove the bank precursor layer formed on the lower electrode of the second region.

By doing so, it is possible to manufacture the organic thin-film transistor, form the lower electrode for the light-emitting element, and connect this lower electrode and the drain electrode to each other. As a result, in addition to the organic thin-film transistor, there is obtained an organic thin-film transistor substrate provided also with a lower electrode for a light-emitting element. According to such an organic thin-film transistor substrate as described above, an image display panel can be made available simply by laminating components of the light-emitting element, such as a light-emitting layer and an upper electrode, on the lower electrode. Thus, it is possible to make manufacturing steps simpler, compared with a case in which the organic thin-film transistor and the light-emitting element are formed in a completely separate manner.

In addition, in the above-described first step, a protection layer is preferably formed between the organic semiconductor layer and a photopolymer layer. By doing so, the organic semiconductor layer is protected by the protection layer, thereby making available an organic thin-film transistor substrate having even more excellent durability. Furthermore, such a protection layer also constitutes part of the bank part, thereby making it possible to further enhance the functions of the substrate, such as insulation by the bank part.

In addition, in the above-described first step, it is also acceptable to: form the source electrode and the drain electrode in the first region on the substrate; form the organic semiconductor layer in the first and second regions on the substrate, so as to cover the source electrode and the drain electrode; form the gate insulation layer on the organic semiconductor layer of the first and second regions; form the gate electrode on the gate insulation layer of the first region; and form the mask layer on the gate insulation layer of a region including the first region and the peripheral part of the second region, so as to cover the gate electrode; and in the second step, selectively remove the bank precursor layer in regions not covered with the mask layer by performing etching.

According to such manufacturing steps as described above, there is formed a top-gate organic thin-film transistor provided with a gate electrode on the upper side thereof. In addition, it is possible to form not only such an organic thin-film transistor as described above but also a sufficiently high bank part including an organic semiconductor layer, a gate insulation layer and a photopolymer layer. As a result, it is possible to skip steps for forming a bank in the same way as described above and, thereby, simplify manufacturing steps. It is also possible to precisely form the bank part by means of etching using a mask layer.

Also in such a manufacturing method as described above, it is preferable that in the first step, a lower electrode for a light-emitting element is formed in the second region on the substrate at least prior to forming the organic semiconductor layer and the drain electrode and the lower electrode are connected during or after the formation of the drain electrode, and that in the second step, the bank precursor layer formed on the lower electrode in the second region is selectively removed. By doing so, it is possible to form not only the organic thin-film transistor but also the lower electrode for the light-emitting element. Use of such an organic thin-film transistor substrate as described above enables the manufacturing steps of an image display panel to be further simplified.

In such a manufacturing method as described above, it is preferable to form a protection layer between the gate insulation layer and the photopolymer layer in the first step. By doing so, the upper portion of the gate insulation layer is covered with the protection layer, thereby making available an organic thin-film transistor even more superior in durability. In addition, a bank part even more superior in characteristics can be made available by including the protection layer.

An organic thin-film transistor substrate in accordance with the present invention, which can be satisfactorily obtained by the above-described manufacturing method of the present invention, wherein an organic thin-film transistor is formed in a first region on a substrate, a second region for forming a light-emitting element in abutment with the first region is included, and a bank part is formed in a peripheral part of the second region, is characterized in that the organic thin-film transistor is provided at least with a gate electrode, a gate insulation layer, a source electrode and a drain electrode formed on a side of this gate insulation layer opposite to the gate electrode, and an organic semiconductor layer formed on a side of the gate insulation layer opposite to the gate electrode and having contact with both the source electrode and the drain electrode, and the bank part includes a layer made of the same material as the material of at least one of the gate insulation layer and the organic semiconductor layer.

In the organic thin-film transistor substrate having such a construction as described above, the bank part includes a layer made of the same material as the material of at least one of the gate insulation layer and the organic semiconductor layer that the organic thin-film transistor has. Accordingly, it is possible to form the bank part by simultaneously forming the organic thin-film transistor and these layers of the bank part and, thereby, manufacture the organic thin-film transistor substrate in a simplified manner even if the substrate includes the bank part. In addition, the gate insulation layer and the organic semiconductor layer have isolation properties adequate under normal conditions. Accordingly, the organic thin-film transistor substrate of the present invention includes a bank part fully capable of functioning as a bank.

In the above-described organic thin-film transistor substrate of the present invention, the bank part preferably includes both a layer made of the same material as the material of the gate insulation layer and a layer made of the same material as the material of the organic semiconductor layer. Such a bank part itself has a height adequate for a bank. Thus, an organic thin-film transistor of the present invention including such a bank part does not require any additional steps for forming the bank part and can therefore be manufactured even more easily.

Furthermore, in the organic thin-film transistor substrate of the present invention, a lower electrode for a light-emitting element is preferably formed in the second region on the substrate. According to the organic thin-film transistor substrate provided previously with the lower electrode for the light-emitting element as described above, there is obtained an image display panel simply by laminating components for the light-emitting element, such as a light-emitting layer and an upper electrode, on this lower electrode. Accordingly, it is possible to perform the manufacture of the image display panel in a simplified manner.

Still furthermore, a method for manufacturing an image display panel in accordance with the present invention includes the above-described method for manufacturing an organic thin-film transistor substrate of the present invention. Hence, the manufacturing method is intended to manufacture an image display panel including: a substrate; an organic thin-film transistor formed in a first region on this substrate; a light-emitting element formed in a second region adjacent to the first region on the substrate; and a bank part formed in a peripheral part of the second region on the substrate so as to surround the light-emitting element; and is characterized by including: a first step of forming, in the first region on the substrate, the organic thin-film transistor provided at least with a gate electrode, a gate insulation layer, a source electrode and a drain electrode formed on a side of this gate insulation layer opposite to the gate electrode, and an organic semiconductor layer formed on a side of the gate insulation layer opposite to the gate electrode and having contact with both the source electrode and the drain electrode, and, after forming a lower electrode for the light-emitting element in the second region on the substrate, forming at least one of the gate insulation layer and the organic semiconductor layer as far as the second region, thereby forming a bank precursor layer composed of a laminated structure formed on the lower electrode in the second region; a second step of selectively removing regions other than the peripheral part in the bank precursor layer and forming the bank part made of the remaining bank precursor layer, thereby obtaining an organic thin-film transistor substrate; and a third step of sequentially forming a light-emitting layer and an upper electrode for the light-emitting element in a region surrounded by the bank part on the lower electrode, thereby forming the light-emitting element.

This method for manufacturing an image display panel includes the above-described method for manufacturing an organic thin-film transistor substrate of the present invention. Consequently, it is possible to form the bank part in the same step as the step in which the organic thin-film transistor is formed. Since the image display panel can be obtained by laminating the light-emitting layer and the upper electrode in the organic thin-film transistor substrate thus obtained, it is possible to reduce the number of manufacturing steps, compared with a conventional method. Accordingly, it is possible to manufacture an image display panel in an even more simplified manner and at even lower costs.

Furthermore, an image display panel in accordance with the present invention, including a substrate; an organic thin-film transistor formed in a first region on this substrate; a light-emitting element formed in a second region adjacent to the first region on the substrate; and a bank part formed in a peripheral part of the second region on the substrate so as to surround the light-emitting element, is characterized in that the organic thin-film transistor is provided at least with a gate electrode, a gate insulation layer, a source electrode and a drain electrode formed on a side of this gate insulation layer opposite to the gate electrode, and an organic semiconductor layer formed on a side of the gate insulation layer opposite to the gate electrode and having contact with both the source electrode and the drain electrode, and the bank part includes a layer made of the same material as the material of at least one of the gate insulation layer and the organic semiconductor layer. An image display panel having such a construction as described above can be satisfactorily manufactured by the above-described manufacturing method of the present invention in a simplified manner and at low costs.

Effect of the Invention

According to the present invention, it is possible to provide a method for manufacturing an organic thin-film transistor substrate including an organic thin-film transistor as a transistor element, wherein a bank can be formed in a smaller number of steps. In addition, according to the present invention, it is possible to provide an organic thin-film transistor substrate obtained by such a manufacturing method as described above, an image display panel, the manufacturing steps of which have been made simple and low-cost by using this organic thin-film transistor substrate, and a method for manufacturing the image display panel.

DESCRIPTION OF SYMBOLS

Figure 1:
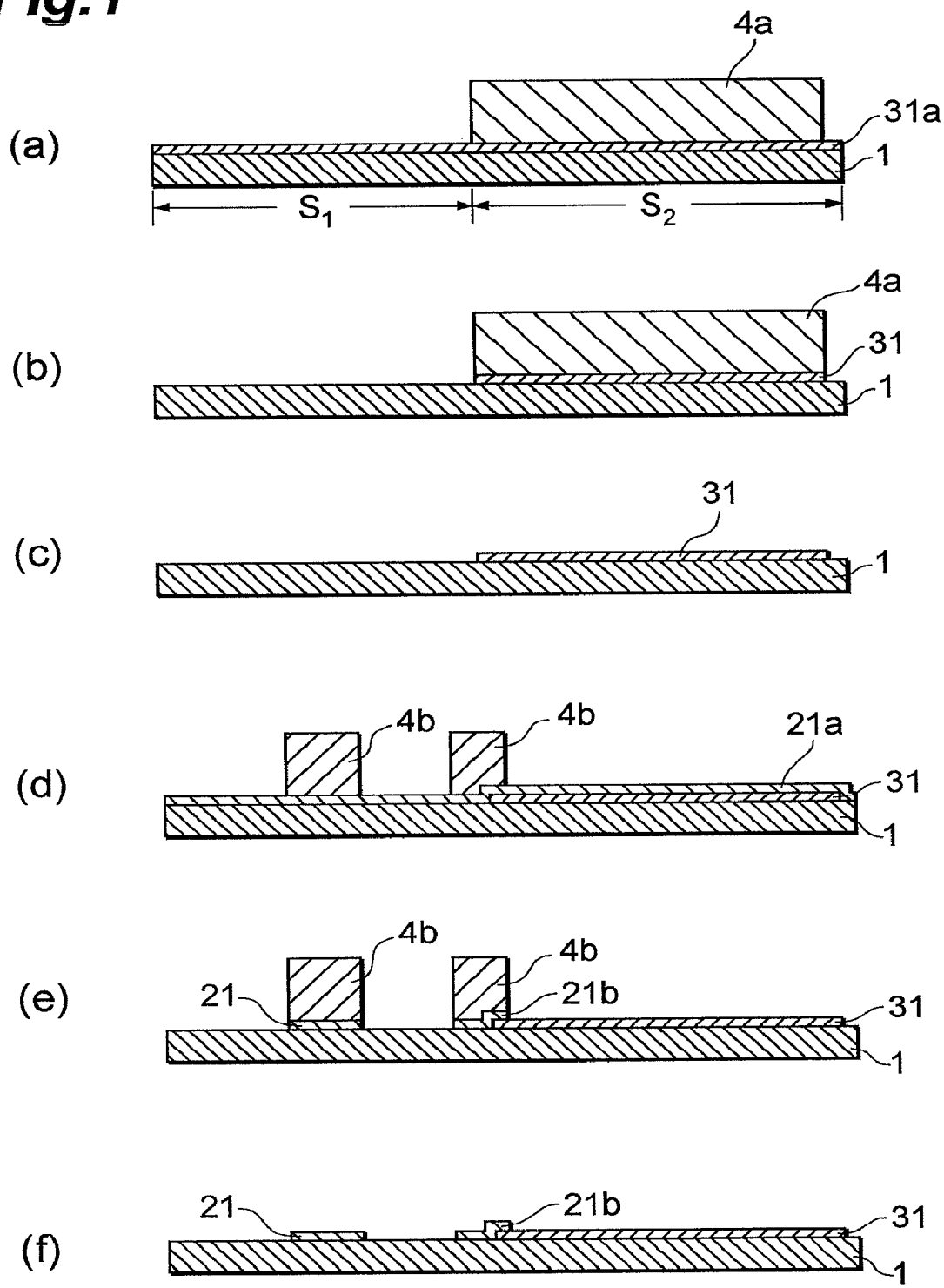
FIG. 1 is a diagram illustrating manufacturing steps of an image display panel in accordance with a first embodiment.
Figure 2:
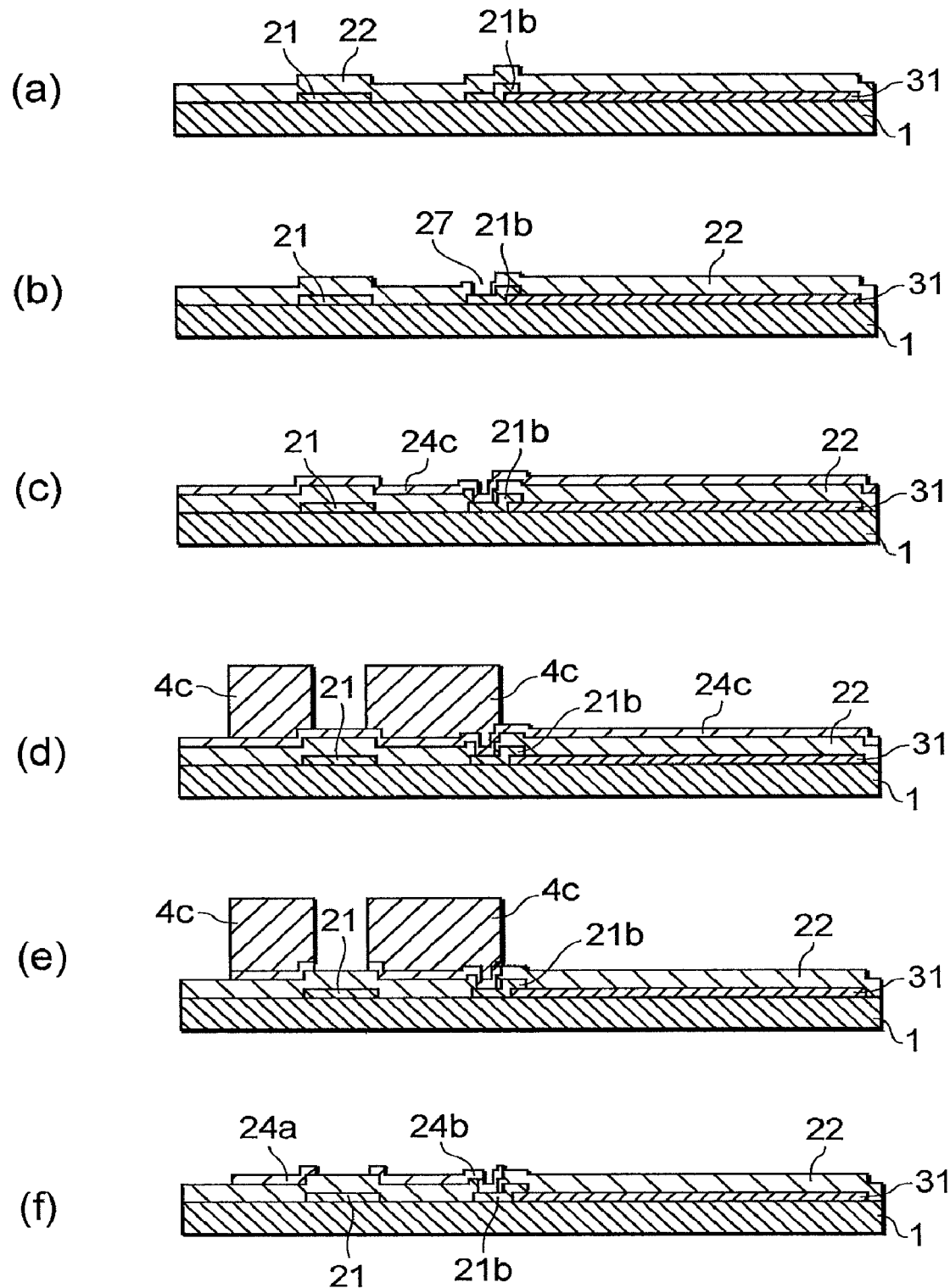
FIG. 2 is another diagram illustrating manufacturing steps of the image display panel in accordance with the first embodiment.
Figure 3:
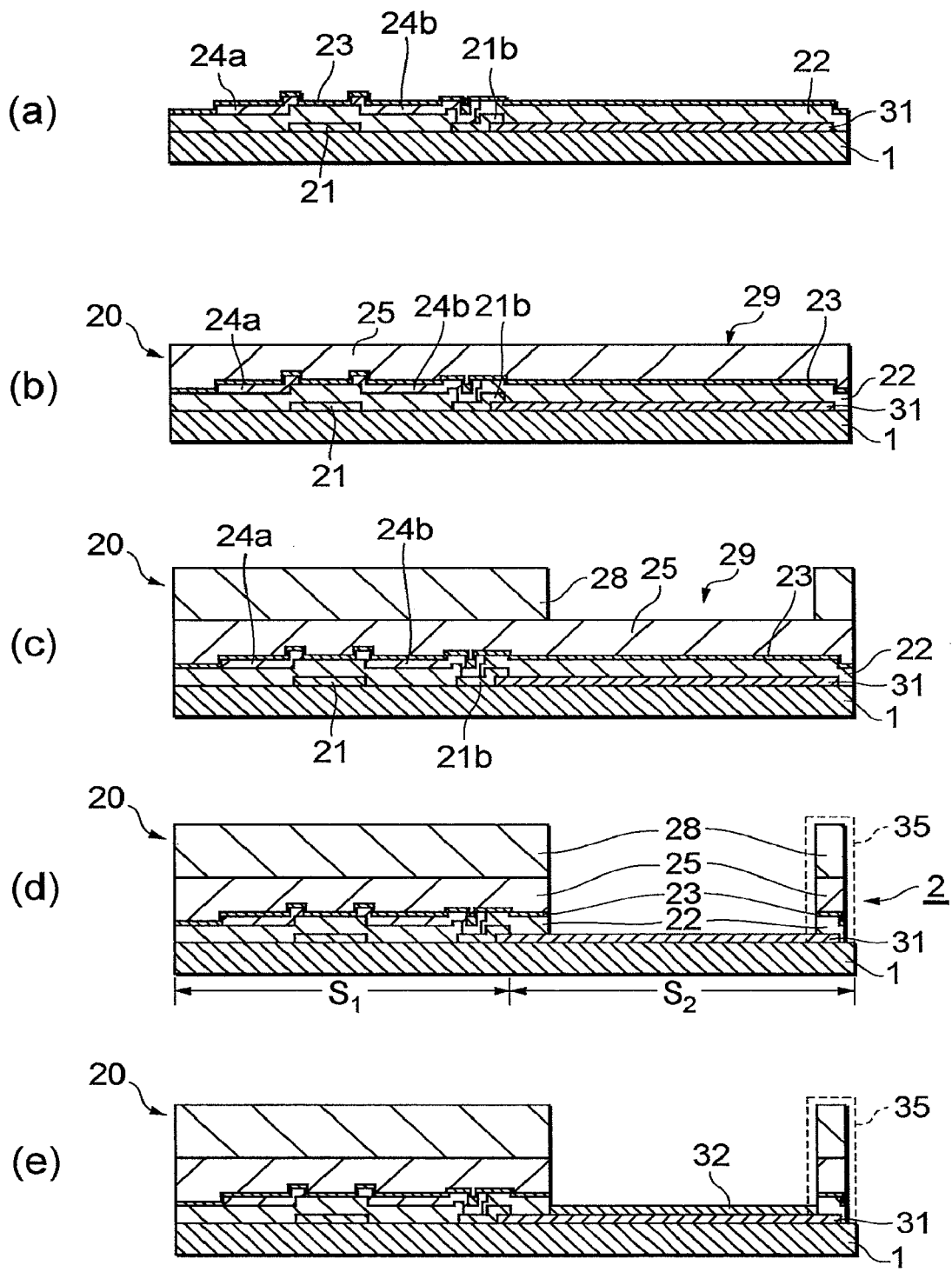
FIG. 3 is yet another diagram illustrating manufacturing steps of the image display panel in accordance with the first embodiment.
Figure 4:
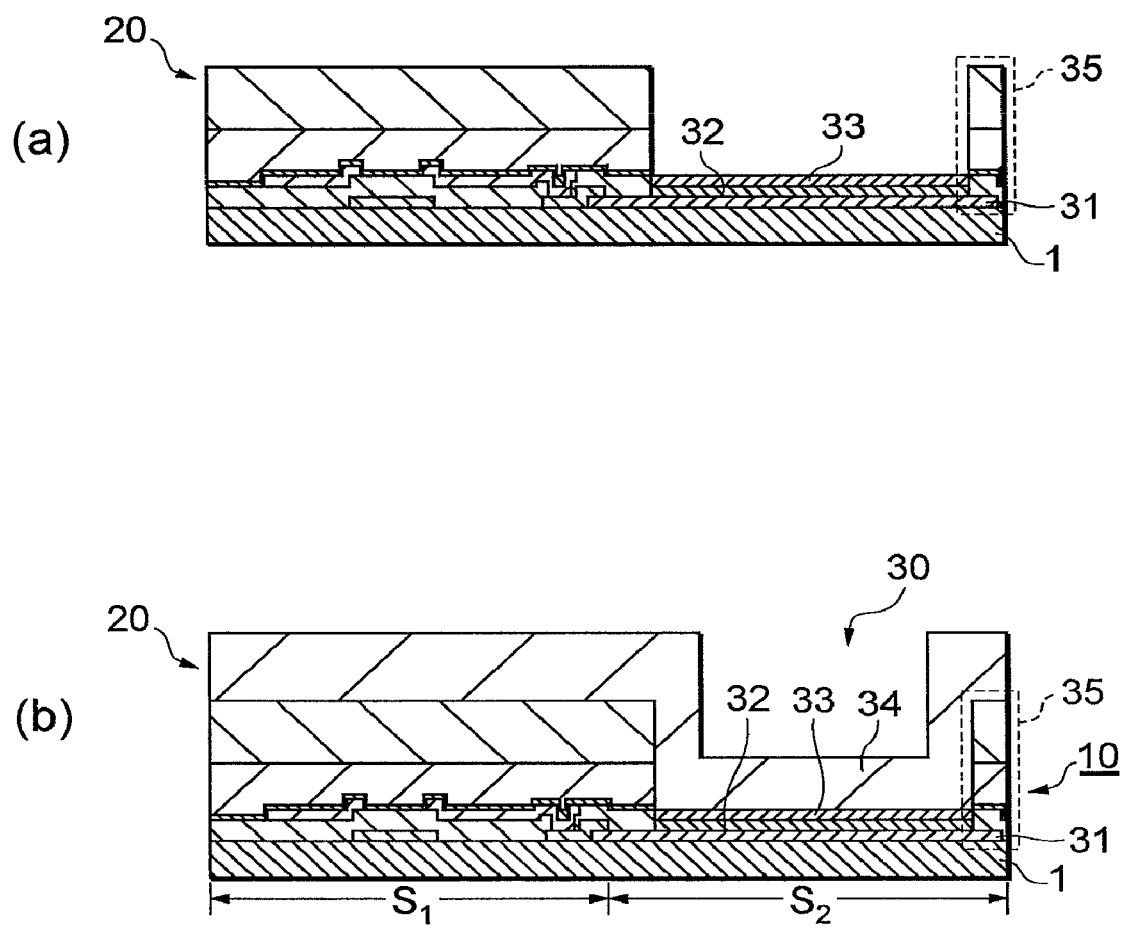
FIG. 4 is still another diagram illustrating manufacturing steps of the image display panel in accordance with the first embodiment.

1 . . . Substrate, 10 . . . Image display panel, 31a . . . Conductive film, 4a, 4b, 4c . . . Resist film, 20 . . . Organic thin-film transistor, 21 . . . Gate electrode, 21b . . . Terminal, 22 . . . Gate insulation layer, 23 . . . . Organic semiconductor layer, 24a . . . Source electrode, 24b . . . Drain electrode, 24c . . . Conductive film, 25 . . . Passivation film, 27 . . . Contact hole, 28 . . . Dry etching mask, 29 . . . Bank precursor layer, 30 . . . Light-emitting element, 31 . . . Anode, 32 . . . Hole-injection layer, 33 . . . Light-emitting layer, 34 . . . Cathode, 35 . . . Bank part, 36 . . . Bank part, 39 . . . Bank precursor layer, 40 . . . Image display panel, 50 . . . Organic thin-film transistor.

BEST MODES FOR CARRYING OUT THE INVENTION

Hereinafter, preferred embodiments of the present invention will be described in detail with reference to the accompanying drawings. In the description of the drawings, like components are denoted by like reference numerals and will not be explained again. In addition, it should be noted that every positional relationship as represented by the terms "upper," "lower," "left" and "right" in the description is based on the positional relationship of the drawing in question.

[First Embodiment]

FIGS. 1 to 4 are diagrams illustrating manufacturing steps of an image display panel in accordance with a first embodiment. In the following description, an explanation will be made of an example in which a bottom-gate organic thin-film transistor including a gate electrode on the substrate side is formed and an organic electroluminescence (EL) element is formed as a light-emitting element.

First, a substrate 1 including a first region $S_1$ and a second region $S_2$ is prepared and an anode (lower electrode) 31 for a light-emitting element 30 is formed in the second region $S_2$ on this substrate 1. Specifically, a conductive film 31a for forming the anode 31 is deposited in the first region $S_1$ and the second region $S_2$ on the substrate 1, for example, and then a resist film 4a is formed on the conductive film 31a of the second region $S_2$ (FIG. 1(a)). Next, using the resist film 4a as a mask, the conductive film 31a in regions in which this resist film 4a is not formed is removed by etching or the like (FIG. 1(b)). After that, the anode 31 for the light-emitting element 30 is formed in the second region $S_2$ on the substrate 1 by removing the resist film 4a (FIG. 1(c)). Note that the first region $S_1$ and the second region $S_2$ of the substrate 1 are not regions explicitly defined by any specific boundaries. Instead, the first and second regions are intended to discriminate, for convenience sake, between a region on the substrate 1 in which the organic thin-film transistor is formed and a region on the substrate 1 in which the light-emitting element is formed.

Here, a glass substrate or a plastic substrate is preferred as the substrate 1. Examples of the plastic substrate include substrates made of heretofore-known materials, such as PEN (polyethylene naphthalene), PC (polycarbonate), TAC (tri-acetyl cellulose), PET (polyethylene terephthalate) and PES (polyethylene sulfone). Note that in cases where a top emission-type organic EL element is formed as a later-described light-emitting element 30, the substrate 1 may be an opaque substrate. For example, a stainless substrate, a single-crystal semiconductor substrate, or the like may be applied.

The illustrated substrate 1 is made of a single layer, but is not limited to this. For example, a substrate which is made of one of the above-described materials and on which an insulating layer is further formed may alternatively be used. This is effective in enhancing insulation between the substrate 1 and an element formed in the upper portion thereof, improving planarity in cases where the surface roughness of a substrate serving as a foundation is large, or protecting surfaces of the substrate 1 from alteration by a chemical liquid or a plasma gas with which the substrate is treated.

For such a insulating film as described above, it is possible to suitably use a film made of a material selected from the group consisting of $SiO_2$, $Si_3N_4$, $Ta_2O_5$, $Al_2O_3$, silicon oxynitride, aluminum oxynitride, poly-para-xylylene, polyimide (PI), PVP (poly-4-vinylphenol), polyvinyl alcohol (PVA), polymethyl methacrylate (PMMA), benzocyclobutene (BCB), cyanoethyl pullulan, TEOS, SOG (Spin-on Glass), and the like.

As a method for forming an insulating film on a substrate, it is possible to select and apply a heretofore known method, such as a plasma CVD method, a sputtering method, a facing-target sputtering method, a spin coating method, a slit coating method, a Cat-CVD method, or an LPCVD method. If the substrate is a metal substrate, the insulating film may be formed by oxidizing or nitriding a surface of the substrate. Alternatively, a metal film or a single-element semiconductor film may temporarily be formed on the substrate, and then the insulating film may be formed by oxidizing or nitriding a surface of the metal or semiconductor film. As a method of oxidization or nitridation, there can be mentioned, by way of example, a method of exposing the substrate to a plasma gas atmosphere containing an O element or an N element or heat-treating the substrate in an atmosphere containing an O element or an N element. Note that the insulating film may not necessarily be a single-layer film, but may be a multilayer laminated film comprised of heterogeneous films.

The anode 31 is made of, for example, a metal oxide, a metal sulfide or a metal thin film having high electrical conductance. Of these films, a film having high optical transmittance is preferred. Specifically, indium oxide, zinc oxide, tin oxide, ITO, IZO, gold, platinum, silver, copper, or the like is used, and ITO, zinc oxide and IZO are particularly preferred. As a film-forming method of such an anode 31 as described above, it is possible to apply a heretofore-known method, such as a resistance heating evaporation method, an EB vapor deposition method, a sputtering method, an ion plating method, a plating method, a CVD method, or the like. In addition, as the anode 31, an organic transparent conductive film, such as polyaniline, a derivative thereof, polythiophene, a derivative thereof, or the like may be applied. The film thickness of the anode 31 may be selected as appropriate, taking into consideration optical transparency and electrical conductance. However, the thickness is preferably, for example, 10 nm to 1 μm and, more preferably, 50 nm to 500 nm.

When the anode 31 is formed in the second region on the substrate 1, a resist film 4a is formed using a heretofore-known photolithography method and the conductive film 31a is patterned by means of heretofore-known etching or the like. For example, if the anode 31 is made of ITO, a resist film 4a made of photoresist may be formed on the conductive film 31a made of ITO, and is then etched using a mixed solution consisting primarily of hydrochloric acid and iron chloride. After that, the resist film 4a may be separated off.

In the manufacture of an image display panel 10, a conductive film 21a to serve as a gate electrode 21 is then formed in the first region $S_1$ and the second region $S_2$ on the substrate 1. After that, a resist film 4b is formed in a desired region on this conductive film 21a (FIG. 1(d)). Subsequently, using the resist film 4b as a mask, the conductive film 21a is removed by etching or the like (FIG. 1(e)). After that, a gate electrode 21 is formed in the first region on the substrate 1 and a terminal 21b for connecting the anode 31 and a later-described drain electrode 24b is also formed by removing the resist film 4b (FIG. 1(O). This terminal 21b is formed in the vicinity of a boundary between the first region and the second region, so that at least one of the edges of the terminal overlaps with the anode 31.

Examples of the gate electrode 21 and the terminal 21b include those made of a thin film of metal, metal oxide, metal sulfide, or the like having high electrical conductance. Specifically, a thin film made of metal, i.e., Cr, Mo, Al, Cu, Au, Pt, Ag, Ti, Ta, Ni, W, Si, In, or Ga, or a thin film made of an alloy or the like consisting primarily of these metals is preferred. In addition, ITO, IZO, zinc oxide, or tin oxide can also be suitably applied. Examples of a method for forming any of these films to form the conductive film 21a include heretofore-known methods, such as a vacuum deposition method, a sputtering method, an ion plating method, a plating method, and a CVD method. The gate electrode 21 and the terminal 21b may also be comprised of an organic transparent conductive film made of polyaniline, a derivative thereof, polythiophene, a derivative thereof, or the like. The film thickness of the gate electrode 21 and the terminal 21b can be selected as appropriate, taking into consideration electrical conductance necessary in order to operate an organic thin-film transistor. The film thickness is preferably, for example, 10 nm to 1 μm and, more preferably, 50 nm to 500 nm.

A step of forming the gate electrode 21 and the terminal 21b can also be carried out using heretofore-known lithography and etching methods. For example, if a Cr film is formed as the gate electrode 21, a resist film 4b made of photoresist is formed on the conductive film 21a made of Cr, and is then etched using a mixed solution containing diammonium cerium (IV) nitrate and perchlorate. After that, the resist film 4b is separated off.

Next, a gate insulation layer 22 is formed in the first region $S_1$ and the second region $S_2$ on the substrate 1, so as to cover the gate electrode 21, the terminal 21b and the anode 31 (FIG. 2(a)). The gate insulation layer 22 is made of, for example, $SiO_2$, $Si_3N_4$, $Ta_2O_5$, $Al_2O_3$, silicon oxynitride, aluminum oxynitride, poly-para-xylylene, polyimide (PI), PVP (poly-4-vinylphenol), polyvinyl alcohol (PVA), polymethyl methacrylate (PMMA), benzocyclobutene (BCB), cyanoethyl pullulan, TEOS, SOG (Spin-on Glass), or the like.

A method for forming such a gate insulation layer 22 as described above can be selected from heretofore-known methods, such as a plasma CVD method, a sputtering method, a facing-target sputtering method, a spin coating method, a slit coating method, a Cat-CVD method, and an LPCVD method. The gate insulation layer 22 may not necessarily be a single-layer film, but may be a multilayer laminated film including heterogeneous films. In addition, the film thickness of the gate insulation layer 22 is, for example, 50 to 1000 nm and preferably 100 nm to 500 nm. In addition, the gate insulation layer 22 preferably has a dielectric breakdown electric field of 0.5 MV/cm or greater and, more preferably, 1.0 MV/cm or greater. According to the gate insulation layer 22 having such a dielectric breakdown electric field as described above, it is possible to apply a strong electric field to a later-described organic semiconductor layer 23 without causing short-circuiting. Thus, excellent mobility becomes available in an organic thin-film transistor 20.

Subsequently, an opening is created in part of the gate insulation layer 22, so as to expose the terminal 21b, thereby forming a contact hole 27 (FIG. 2(b)). Note that if a plurality of organic thin-film transistors (not illustrated) are formed within a single pixel, a plurality of contact holes 27 may be formed in the gate insulation layer 22 for the electrical interconnection of these organic thin-film transistors.

The contact hole 27 can be formed by, for example, pattern-forming photoresist using a photolithography method, removing an insulating film in the contact hole 27 by etching, and then separating off the photoresist. As the etching method, both a wet etching method and a dry etching method can be selected as appropriate and applied. In addition, an opening may be provided in the gate insulation layer 22 using a laser ablation method. Furthermore, film formation through a metal mask, for example, may be performed when forming the gate insulation layer 22, so that the gate insulation layer 22 includes an opening (contact hole 27) in part thereof.

Next, a source electrode 24a and a drain electrode 24b are formed on the gate insulation layer 22 of the first region $S_1$. In the formation of the source electrode 24a and the drain electrode 24b, a conductive film 24c for forming these electrodes, for example, is first formed on the gate insulation layer 22 of the first region $S_1$ and the second region $S_2$ (FIG. 2(c)). Subsequently, a resist film 4c is formed in regions in which the source electrode 24a and the drain electrode 24b of the first region $S_1$ are to be formed (FIG. 2(d)). After that, the conductive film 24c is etched using this resist film 4c as a mask (FIG. 2(e)), thereby removing the resist film 4c (FIG. 2(f)). At this time, the drain electrode 24b is formed as far as the inside of the above-described contact hole 27, so that the drain electrode 24b and the terminal 21b are connected to each other.

The source electrode 24a and the drain electrode 24b are made of, for example, a thin film of metal, metal oxide, or metal sulfide having high electrical conductance. Specifically, a metal, i.e., Cr, Mo, Al, Cu, Au, Pt, Ag, Ti, Ta, Ni, W, Si, In or Ga, or an alloy consisting primarily of these metals can be applied to the source electrode 24a and the drain electrode 24b. ITO, IZO, zinc oxide, and tin oxide are also preferred. As a method for forming the conductive film 24c, it is possible to apply a heretofore-known method, such as a resistance heating evaporation method, an EB vapor deposition method, a sputtering method, an ion plating method, a plating method, or a CVD method. In addition, the source electrode 24a and the drain electrode 24b may be comprised of an organic transparent conductive film made of polyaniline, a derivative thereof, polythiophene, a derivative thereof, or the like. The film thickness of the source electrode 24a and the drain electrode 24b is preferably selected as appropriate, taking into consideration electrical conductance necessary in order to operate an organic thin-film transistor 20. For example, the film thickness is preferably 10 nm to 1 μm and, more preferably, 50 nm to 500 nm.

The formation of the resist film 4c and the etching of the conductive film 24c can be performed by applying heretofore-known photolithography and etching methods. If, for example, a source electrode 24a and a drain electrode 24b made of Au are formed, a conductive film 24c made of Au is formed, and then a photoresist-based patterned resist film 4c is formed. Subsequently, the resist film is etched using a mixed solution containing potassium iodide and iodine.

Note that the source electrode 24a and the drain electrode 24b can also be formed by performing patterning using a laser ablation method. Alternatively, the source electrode 24a and the drain electrode 24b may be directly formed on the gate insulation layer 22 by performing pattern formation through a metal mask at the time of film formation. However, the patterning must be performed with high precision since the source electrode 24a and the drain electrode 24b are finely aligned with respect to the gate electrode 21 and, thereby, the channel length and channel width of a transistor is determined. Accordingly, it is preferable to use a photolithography method capable of higher-precision patterning for the formation of the source electrode 24a and the drain electrode 24b.

In the manufacture of an image display unit, an organic semiconductor layer 23 is then formed on the gate insulation layer 22 of the first region $S_1$ and the second region $S_2$, so as to cover the source electrode 24a and the drain electrode 24b (FIG. 3(a)). As the organic semiconductor layer 23, it is possible to apply a semiconductor layer made of a low-molecular organic semiconducting material or a high-molecular organic semiconducting material without any particular limitation. If a low-molecular organic semiconducting material, such as pentacene, is used, the organic semiconductor layer 23 can be formed by performing film formation using a resistance heating evaporation method. In this case, the organic semiconducting material is preferably oriented, in order to form an organic semiconductor layer 23 having high mobility. For example, a low-molecular organic semiconducting material, such as pentacene, can be self-oriented by previously treating a surface of the gate insulation layer 22 using a silane coupling agent or the like.

On the other hand, if a high-molecular organic semiconducting material, such as poly-3-hexylthiophene (P3HT) or fluorene-dithiophene (F8T2), is used, the organic semiconductor layer 23 can be formed by dissolving these materials in a solvent and performing a coating method, such as a spin coating method, a casting method, a microgravure coating method, a gravure coating method, a bar coating method, a roll coating method, a wire bar coating method, a dip coating method, a spray coating method, a screen printing method, a flexo printing method, an offset printing method, or an ink-jet printing method. From the viewpoint of performing pattern formation with ease, a screen printing method, a flexo printing method, an offset printing method, or an ink-jet printing method is preferred. Note that even if a low-molecular organic semiconducting material is used, any of these coating methods may be applied by making the material soluble in a solvent.

After that, a passivation film (protection layer) 25 is formed on the organic semiconductor layer 23 of the first region $S_1$ and the second region $S_2$ (FIG. 3(b)). Consequently, an organic thin-film transistor 20 is formed in the first region $S_1$ on the substrate, and a bank precursor layer 29, in which the gate insulation layer 22, the organic semiconductor layer 23 and the passivation film 25 are laminated, is formed on the anode 31 of the second region $S_2$.

The passivation film 25 is made of an insulating material. The passivation film 25 is preferably made of, for example, $SiO_2$, $Si_3N_4$, $Ta_2O_5$, $Al_2O_3$, silicon oxynitride, aluminum oxynitride, polyparaxylylene (poly-para-xylylene), polyimide (PI), PVP (poly-4-vinylphenol), polyvinyl alcohol (PVA), polymethyl methacrylate (PMMA), benzocyclobutene (BCB), cyanoethyl pullulan, TEOS, or SOG (Spin-on Glass).

The passivation film 25 can be formed by laminating the above-described materials using a heretofore-known method, such as a plasma CVD method, a sputtering method, a facing-target sputtering method, a spin coating method, a slit coating method, a Cat-CVD method, or an LPCVD method. The thickness of this passivation film 25 is preferably 10 to 5000 nm and, more preferably, 200 to 2000 nm.

This passivation film 25 need not necessarily be a single-layer film, but may be a multilayer film in which heterogeneous films are laminated. For example, a multilayer film in which organic films and inorganic films are alternately laminated is preferred. When organic and inorganic films are alternately laminated, a heated monomer is first supplied to a nozzle inside a film-forming chamber and the monomer is vapor-deposited on a substrate located in an upper portion of the chamber. Then, UV light is irradiated to the substrate to change the monomer into a polymer. Consequently, air bubbles within the films are filled, thereby improving air-tightness. Next, $SiO_2$ or $SiN_x$ is film-formed using a sputtering method or the like. Consequently, film strength is increased. By repeating such steps as described above, it is possible to form the passivation film 25 comprised of multiple organic and inorganic layers superior in air-tightness and film strength.

After the passivation film 25 is formed in this way, a dry etching mask (mask layer) 28 is formed in a predetermined region on this film (FIG. 3(c)). The dry etching mask 28 is formed in the first region $S_1$ and in a peripheral part of the second region $S_2$ except a region for forming a light-emitting element 30. Consequently, an upper portion of the organic thin-film transistor 20 and a region for forming a bank part 35 are covered with the dry etching mask 28. The dry etching mask 28 can be formed by patterning a photopolymer film using a heretofore-known photolithography method.

Subsequently, dry etching is performed using the dry etching mask 28 as a protective film, to remove the bank precursor layer 29 in regions not covered with the dry etching mask 28 (FIG. 3(d)). This dry etching is performed until the anode 31 formed in the second region $S_2$ is exposed. Consequently, the bank precursor layer 29 formed on the anode 31 and composed of a laminated structure is removed. Thus, there is formed a region for forming a light-emitting element 30 in the second region $S_2$. There is also formed a bank part 35 out of the bank precursor layer 29 of a peripheral part that remained after etching. As a result, an organic thin-film transistor 10 and a bank part 35 are formed on the substrate 1, and an organic thin-film transistor substrate 2 having the region for forming the light-emitting element 30 is obtained.

Dry etching can be performed using a heretofore-known method, such as an ICP plasma etching method, an RIE etching method, an ECR etching method, or a normal-pressure plasma etching method. If, for example, a layer made of organic matter is etched, it is preferable to etch the layer in an oxygen-containing etching gas atmosphere. If a layer made of inorganic matter is etched, it is preferable to change etching gas conditions according to the constituent material of the layer. For example, a $CF_4$ gas or a $CHF_3$ gas is preferred in the case of an $SiO_2$ film, and an etching gas containing a $CCl_4$ gas or a $BCl_3$ gas is preferred in the case of an $Al_2O_3$ film. If the bank precursor layer 29 is a multilayer film including both of these films, etching may be performed continuously while changing the etching gas and etching conditions.

Note that in order to enable the respective electrodes (gate electrode 21, source electrode 24a and drain electrode 24b) of the organic thin-film transistor 20 to have contact with external interconnects in this dry etching, respective layers formed on these regions of contact may be removed, though this is not illustrated.

In the organic thin-film transistor substrate 2, the bank part 35 has a four-layer structure including the gate insulation layer 22, the organic semiconductor layer 23, the passivation film 25 and the dry etching mask 28. That is, the bank part 35 includes the same four layers included in the organic thin-film transistor 20. Note that the dry etching mask 28 need not necessarily be left on the uppermost layer of the bank part 35, but may be removed after dry etching.

In the bank part 35 having the above-described construction, the gate insulation layer 22, the passivation film 25 and the dry etching mask 28 themselves have excellent insulation properties. In addition, the organic semiconductor layer 23 can maintain excellent insulation properties since no voltages are applied thereto. Accordingly, the bank part 35 can, for example, fully maintain insulation from adjacent pixels. Thus, the bank part 35 has excellent characteristics as a bank. In addition, by having such a laminated structure as described above, the bank part 35 as a whole can maintain adequate insulation properties even if pinholes are formed in some layers or foreign matter is mixed between some layers. According to such a bank part 35 as described above, it is possible to significantly reduce the occurrence of leakage currents or the like between the bank part 35 and an adjacent pixel or the like.

After the organic thin-film transistor substrate 2 is manufactured in this way, a light-emitting element 30 is formed in a region of the substrate 2 for forming a light-emitting element. Specifically, a hole-injection layer 32 is first formed on the anode 31 formed on the substrate 1 of the organic thin-film transistor substrate 2 (FIG. 3(e)). Here, the hole-injection layer 32 refers to a layer having properties capable of improving the efficiency of injection of electron holes from the anode 31.

For such a hole-injection layer 32 as described above, it is possible to apply a layer having the same functions as those of a layer in an organic EL element without any particular limitation. Examples of the layer include those made of phthalocyanine complex, such as copper phthalocyanine, aromatic amine derivatives, such as 4,4',4''-tris (3-methyl-phenyl-phenylamino) triphenylamine, hydrazone derivatives, carbazole derivatives, triazole derivatives, imidazole derivatives, oxadiazole derivatives having amino group, polythiophene, and PEDOT/PSS.

If the hole-injection layer 32 is film-formed from a solid raw material, a resistance heating evaporation method, an EB vapor deposition method, and an MOCVD method are preferred. If the hole-injection layer 32 is pattern-formed, it is possible to apply a method of through-evaporation patterning through an opening in a metal mask. As a method for forming the hole-injection layer 32 when the layer is film-formed from a liquid raw material, it is possible to use a coating method, such as a spin coating method, a casting method, a microgravure coating method, a gravure coating method, a bar coating method, a roll coating method, a wire bar coating method, a dip coating method, a spray coating method, a screen printing method, a flexo printing method, an offset printing method, or an ink-jet printing method.

The thickness of the hole-injection layer 32 is preferably 5 to 300 nm, or so. If the thickness is too small, film formation may become difficult. Alternatively, if the thickness is too large, a voltage to be applied to the light-emitting layer 33 may become excessively large.

Note that although only one hole-injection layer 32 is formed in the present embodiment, a hole-transport layer, for example, may be formed in place of this hole-injection layer 32 or the hole-transport layer may be formed in combination with the hole-injection layer 32. Here, the hole-transport layer refers to a layer having properties for advantaging the transport of electron holes from the anode or the hole-injection layer 32 to the light-emitting layer 33, thereby further improving the injection of electron holes. If both the hole-injection layer and the hole-transport layer are provided, it is preferable to apply a layer adjacent to the anode as the hole-injection layer and other layers as the hole-transport layers.

As the hole-transport layer, it is possible to apply, without any particular limitation, a layer made of, for example, an aromatic amine derivative, such as N,N'-diphenyl-N,N'-di(3-methylphenyl)4,4'-diaminobiphenyl (TPD) or 4,4'-bis[N-(1-naphthyl)-N-phenylamino] biphenyl (NPB). A preferred film-forming method and a preferred thickness of the hole-transport layer are the same as those of the hole-injection layer 32.

Next, a light-emitting layer 33 is formed on the hole-injection layer 32 (FIG. 4(a)). The light-emitting layer 33 is a heretofore-known layer applied as a light-emitting layer of an organic EL element. Light emission can be caused in the layer by applying a voltage or flowing a current between the anode 31 and the cathode 34. As the constituent material of the light-emitting layer 33, it is possible to apply any materials, without any particular limitation, as long as the materials have such characteristics as described above. Examples of the constituent material include a distyrylbiphenyl-based material, a dimesitylboryl-based material, a stilbene-based material, a dipyrilyl dicyanobenzene material, a benzoxazole-based material, a distyryl-based material, a carbazole-based material, a dibenzo chrysene-based material, an arylamine-based material, a pyrene-substituted oligothiophene-based material, a PPV oligomer-based material, a carbazole-based material, and a polyfluorene-based material.

As a method for film-forming the light-emitting layer 33 from a liquid raw material, it is possible to use a coating method, such as a spin coating method, a casting method, a microgravure coating method, a gravure coating method, a bar coating method, a roll coating method, a wire bar coating method, a dip coating method, a spray coating method, a screen printing method, a flexo printing method, an offset printing method, or an ink-jet printing method. Of these methods, a screen printing method, a flexo printing method, an offset printing method, or an ink-jet printing method is preferable in that pattern formation and multicolor selective coating are easy. In a method in which films are formed from a liquid raw material as described above, all that is needed is to remove a solvent by drying a solution after the solution is coated. In addition, since the same method is applicable even if a charge transport material is mixed with the light-emitting layer 33, the method is extremely advantageous in terms of manufacturing. The light-emitting layer 33 can also be film-formed from a solid raw material. In this case, a resistance heating evaporation method, an EB vapor deposition method, or an MOCVD method can be applied. If pattern formation or multicolor selective coating is performed, it is preferable to perform through-evaporation patterning through an opening in a metal mask.

The thickness of the light-emitting layer 33 is not limited in particular but can be changed as appropriate, according to intended design. For example, the thickness is preferably 10 to 200 nm, or so. If the thickness of the light-emitting layer 33 is too small, the recombination of electrons and electron holes does not fully take place. Thus, there is the possibility of being unable to obtain adequate brightness. In addition, there may arise disadvantages, such as the difficulty of film formation. On the other hand, if the thickness is too large, a voltage to be applied becomes excessively high and the efficiency of the light-emitting layer 33 tends to worsen.

Subsequently, a cathode 34 is formed so as to cover the entire area of the first region $S_1$ and the second region $S_2$, thereby completing the image display panel 10. Forming the cathode 34 in this way results in that the cathode 34 is located on the light-emitting layer 33, and a light-emitting element 30 provided with the anode 31, the hole-injection layer 32, the light-emitting layer 33 and the cathode 34 in the order from the substrate 1 side is formed in the second region $S_2$.

As the cathode 34, a layer made of a material having a small work function is preferred. Examples of such a material include metals, such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium, alloys containing two or more types of these metals, alloys of one or more types of these metals and one or more of gold, silver, platinum, copper, manganese, titanium, cobalt, nickel, tungsten and tin, and graphite or graphite intercalation compound. Examples of an alloy constituting the cathode 34 include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The film thickness of the cathode 34 can be selected as appropriate, taking into consideration electrical conductance and durability. The film thickness is preferably, for example, 10 nm to 10 µm, more preferably 20 nm to 1 µm, and even more preferably 50 nm to 500 nm. The cathode 34 can be formed by film-forming the above-described materials using a resistance heating evaporation method, an EB vapor deposition method, a sputtering method, or the like. Note that the cathode 34 may have a laminated structure including two or more layers.

Also note that in the light-emitting element 30, an electron-injection layer (not illustrated) may be formed as appropriate between the light-emitting layer 33 and the cathode layer 34. The electron-injection layer is a layer having properties capable of improving the effect of electron injection from the cathode 34 into the light-emitting layer 33. Examples of the constituent material of the electron-injection layer include Ba, Ca, CaF, LiF, Li, and NaF. In addition, the thickness of the electron-injection layer is preferably 3 to 50 nm, or so. If the thickness is too small, the film thickness of the layer tends to be difficult to control, thus making stable manufacturing difficult. On the other hand, if the thickness is too large, a voltage to be applied to the light-emitting layer 33 tends to become excessively large.

According to such a manufacturing method as described above, an organic thin-film transistor 20 is formed in the first region $S_1$ on the substrate 1, and an image display panel 10, in which the light-emitting element 30 surrounded by the bank part 35 is formed in the second region $S_2$, is obtained. This image display panel 10 preferably has a structure in which the panel is sealed so that respective elements on the substrate 1 are covered (not illustrated). In this case, sealing is preferably performed immediately after the cathode 34 is formed.

As a method of sealing, a heretofore-known method can be applied. For example, in a method in which a metal cap substrate or a glass cap substrate is used as a backside cap substrate, a sealing adhesive agent is coated on an element-side surface of the substrate 1 and these substrates are bonded together. Then, the sealing adhesive agent is hardened by means of UV irradiation or heating. Note that for the backside cap substrate, a processed substrate having a hollow structure is used in some cases, in order to locate an absorbent material inside the substrate. Examples of a method for processing the substrate include a machined molding method, a sandblasting method, and a wet etching method.

If a vapor deposition apparatus is used to form the cathode 34, it is desirable to integrate a sealing apparatus for performing a sealing step with the vapor deposition apparatus, in order to perform sealing without exposing respective elements on the substrate 1 to the atmosphere. Examples of a sealing method include a method for performing sealing by forming a thin film on the upper portions of the respective elements on the substrate 1. As this thin film-based sealing method, there can be mentioned a method for forming an organic film, an inorganic multilayer film made of $SiO_xSiN_X$ or the like, a multilayer laminated film comprised of organic and inorganic films, or the like on an upper portion of an element, so that the film serves as a gas barrier layer.

Having thus described a method for manufacturing an image display panel of the first embodiment, the above-described steps can be changed as appropriate within the scope of the present invention. For example, although in the above-described manufacturing method, the gate electrode 21 and the terminal 21b are formed after the anode 31 is formed, the present invention is not limited to this. Alternatively, the anode 31 may be formed after the gate electrode 21 and the terminal 21b are formed. This order of formation is preferably selected so that an electrode or the like to be formed earlier has sufficient resistance to etching to be performed on an electrode or the like to be formed later.

Also in the above-described embodiment, both the anode 31 and the gate electrode 21 are pattern-formed by a combination of a photolithography method and a wet etching method, the present invention is not limited to this. Alternatively, a heretofore-known pattern formation method can also be applied. For example, a combination of a photolithography method and a dry etching method may be applied. Still alternatively, pattern formation may be performed using a laser ablation method. Still alternatively, a layer having a predetermined pattern may be formed by performing pattern formation or the like through a metal mask at the time of film-forming these electrodes.

Furthermore, the gate electrode 21 and the anode 31 may be the same in constituent material and film thickness. In this case, the gate electrode 21 and the anode 31 can be formed in the same step. Consequently, it is possible to further reduce the number of steps. Still furthermore, the terminal 21b formed along with the gate electrode 21 may not necessarily be formed, if the drain electrode 24b and the anode 31 can be directly connected to each other.

Still furthermore, although both the passivation film 25 and the dry etching mask 28 are formed in the above-described embodiment, the passivation film 25 may be made of, for example, a material capable of photolithography, such as a photosensitive acrylic resin, so as to also serve the functions of the dry etching mask 28.

In addition, in the manufacture of the organic thin-film transistor substrate 2, a metal layer or a metal oxide layer may be formed between the above-described passivation film 25 and the dry etching mask 28. In this case, a metal or a metal oxide, for example, is film-formed on the passivation film 25 of the first and second regions $S_1$ and $S_2$, and then the dry etching mask 28 is pattern-formed on this film. Using this pattern as a mask, the metal layer or the metal oxide layer is patterned using a heretofore-known wet etching method or the like. The metal layer or the metal oxide layer thus formed can be used as part of the dry etching mask for bank formation, along with the dry etching mask 28.

The dry etching mask 28 made of a photosensitive resin may suffer damage depending on etching conditions. However, by forming the metal layer and the metal oxide layer as described above, it is possible to even more reliably protect an organic thin-film transistor 20 and a bank-forming region against damage by etching. If moisture in the atmosphere, oxygen, light or the like transmits through the passivation film 25 and reaches the organic thin-film transistor 20, a deterioration may be caused in the organic semiconductor layer 23 or the like, thus degrading the characteristics thereof. However, by forming such a metal layer or a metal oxide layer as described above, it is possible to prevent the transmission of the above-described moisture or the like. By forming the metal layer or the metal oxide layer in this way, it is possible to manufacture an even more highly reliable organic thin-film transistor substrate 2 and image display panel 10.

Examples of the constituent material of the metal layer or the metal oxide layer include Ni, Au, Cr, Cu, Mo, W, Ti, Ta, Al, ITO, IZO, zinc oxide, and tin oxide. In addition, as a method for film-forming the metal layer or the metal oxide layer, it is possible to apply a resistance heating evaporation method, an EB vapor deposition method, a sputtering method, an ion plating method, a plating method, a CVD method, or the like.

[Second Embodiment]

FIGS. 5 to 8 are diagrams illustrating manufacturing steps of an image display panel in accordance with a second embodiment. In the following description, an explanation will be made of an example in which a top-gate organic thin-film transistor including a gate electrode on an upper portion thereof is formed and an organic EL element is formed as a light-emitting element. Note that the same materials and manufacturing methods can be applied to the same constituent elements as those of the above-described first embodiment and, therefore, the constituent elements will not be explained hereinafter.

Figure 5:
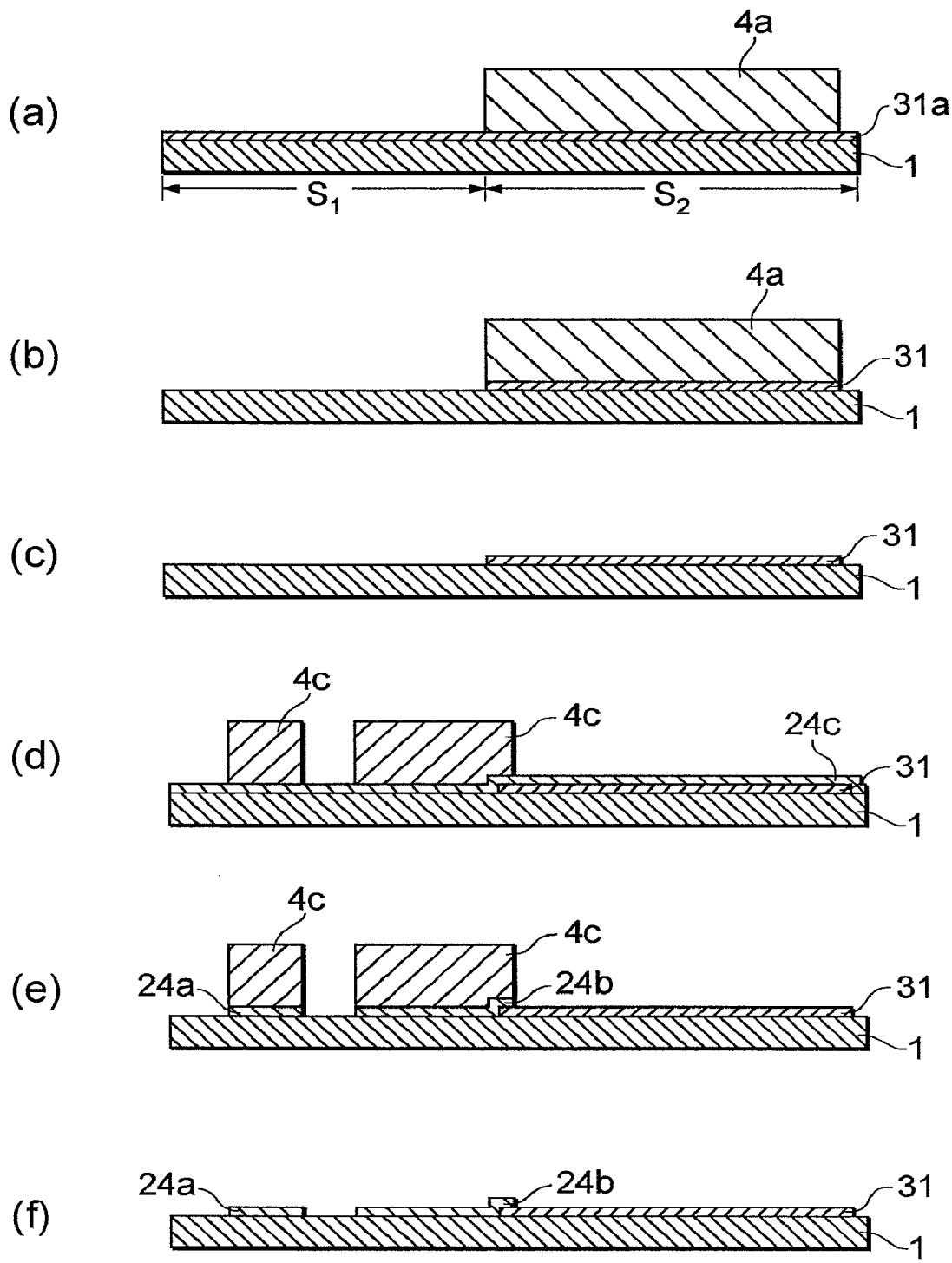
FIG. 5 is a diagram illustrating manufacturing steps of an image display panel in accordance with a second embodiment.

First, on a substrate 1 including a first region $S_1$ and a second region $S_2$, there is formed an anode 31 for a light-emitting element 30 in the second region $S_2$ in the same way as in the first embodiment (FIGS. 5(*a*) to 5(*c*)).

Next, a conductive film 24*c* to serve as a source electrode 24*a* and a drain electrode 24*b* is formed in the first region $S_1$ and the second region $S_2$ on the substrate 1, and then a resist film 4*c* is formed in regions in which the source electrode 24*a* and the drain electrode 24*b* are to be formed (FIG. 5(*d*)). Then, using the resist film 4*c* as a mask, the conductive film 24*c* is removed by etching or the like (FIG. 5(*e*)). After that, the source electrode 24*a* and the drain electrode 24*b* are formed in the first region $S_1$ on the substrate 1 by removing the resist film 4*c* (FIG. 5(*f*)). At this time, the drain electrode 24*b* is formed so that one edge thereof overlaps with the anode 31, thereby allowing the drain electrode 24*b* and the anode 31 to be electrically connected to each other.

Figure 6:
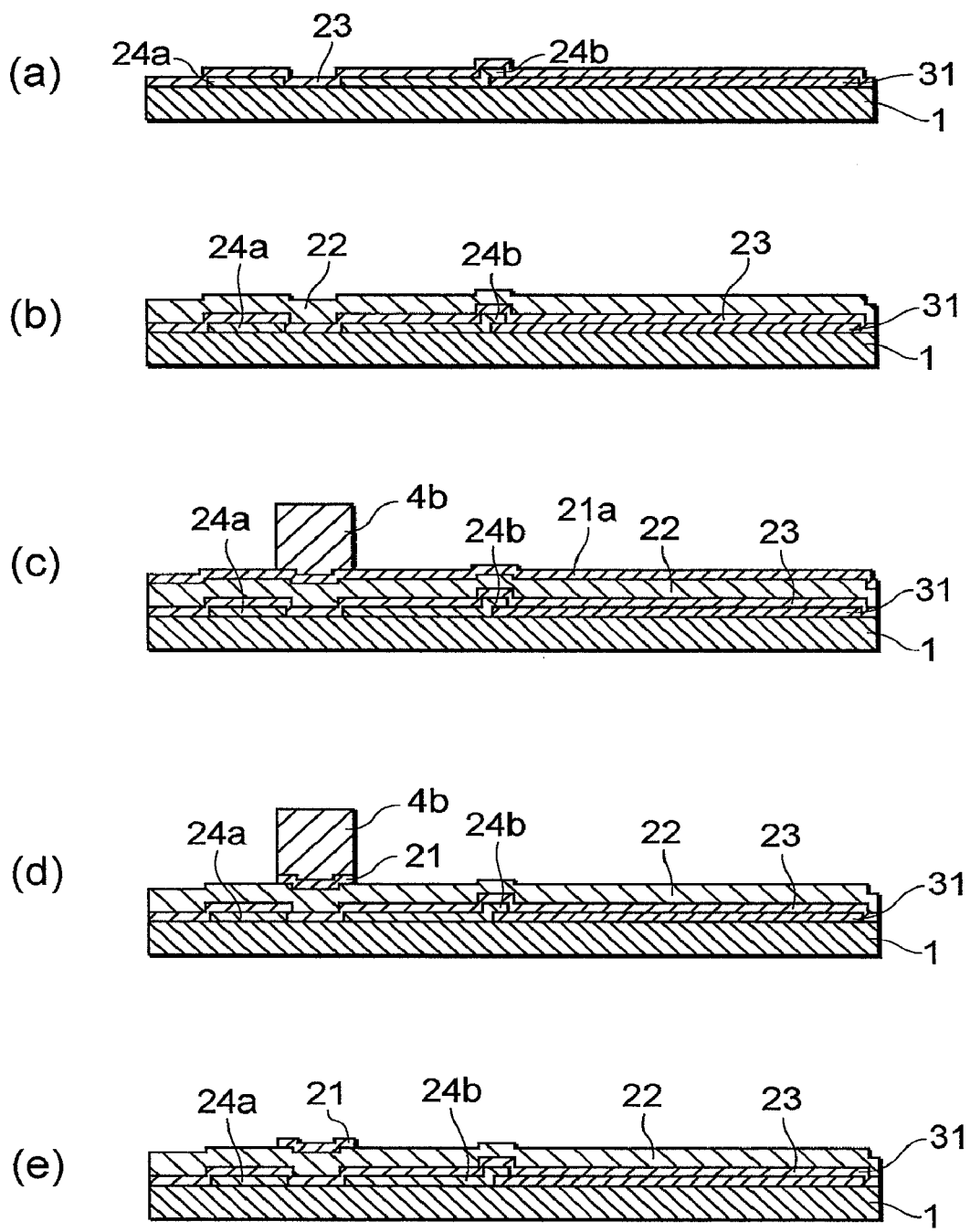
FIG. 6 is another diagram illustrating manufacturing steps of the image display panel in accordance with the second embodiment.

Subsequently, an organic semiconductor layer 23 is formed in the first region $S_1$ and the second region $S_2$ on the substrate 1 in the same way as in the above-described first embodiment, so as to cover the source electrode 24*a*, the drain electrode 24*b* and the anode 31 (FIG. 6(*a*)). Then, a gate insulation layer 22 is formed on this organic semiconductor film 23 (FIG. 6(*b*)).

After the gate insulation layer 22 is formed in this way, a gate electrode 21 is formed on the gate insulation layer 22 of the first region $S_1$. In the formation of this gate electrode 21, a conductive film 21*a* to serve as the gate electrode 21 is first formed on the gate insulation layer 22 of a region including the first region $S_1$ and the second region $S_2$, and then a resist film 4*b* is formed in a region in which the gate electrode 21 is to be formed (FIG. 6(*c*)). Next, using the resist film 4*b* as a mask, the conductive film 21*a* is removed by etching or the like (FIG. 6(*d*)). After that, the gate electrode 21 is formed on the gate insulation layer 22 of the first region by removing the resist film 4*b* (FIG. 6(*e*)).

Figure 7:
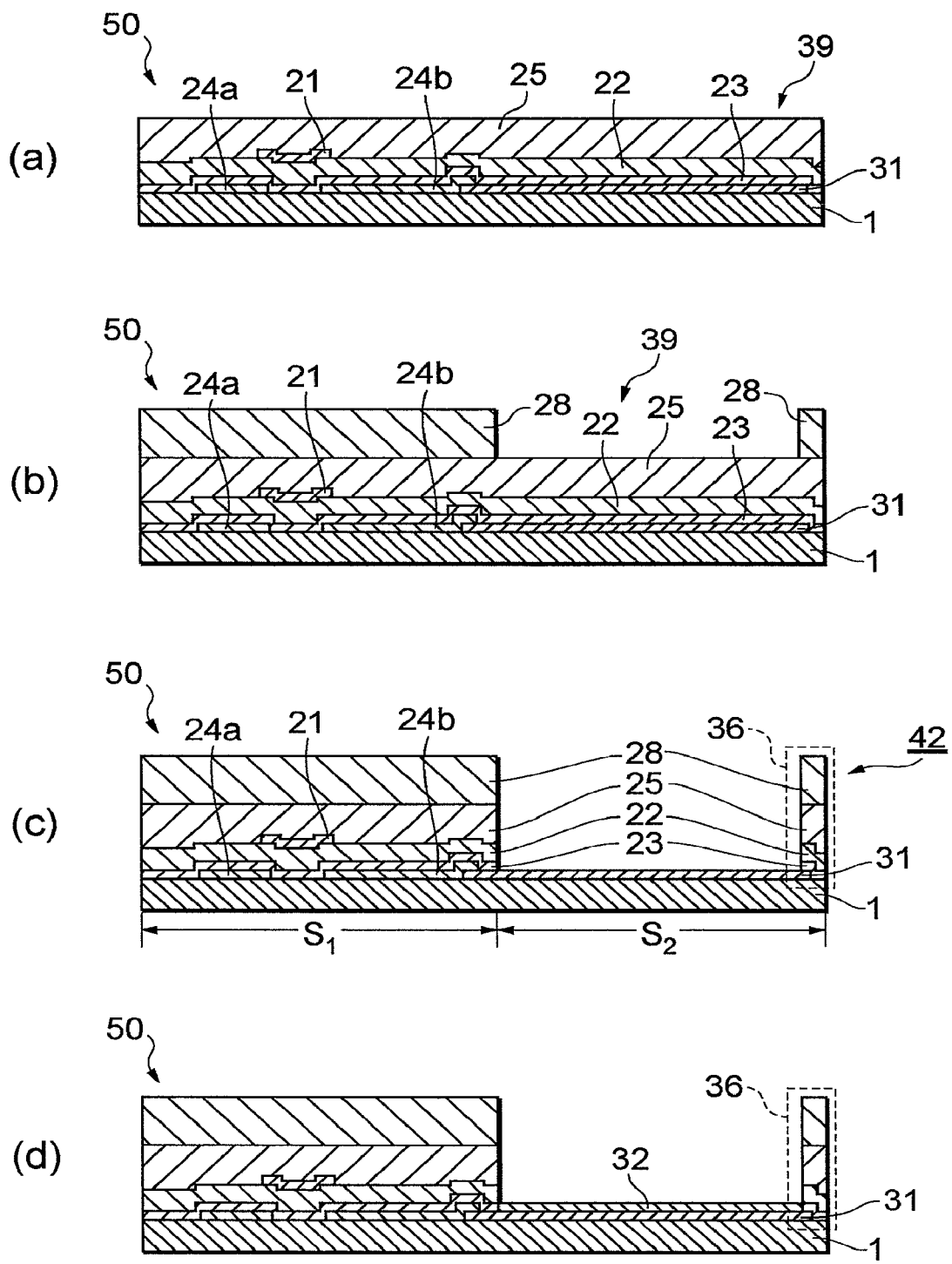
FIG. 7 is yet another diagram illustrating manufacturing steps of the image display panel in accordance with the second embodiment.

Then, a passivation film 25 is formed on the gate insulation layer 22 of the first region $S_1$ and the second region $S_2$, so as to cover the gate electrode 21 (FIG. 7(*a*)). Consequently, an organic thin-film transistor 50 is formed in the first region $S_1$ on the substrate 1 and a bank precursor layer 39, in which the gate insulation layer 22, the organic semiconductor layer 23 and the passivation film 25 are laminated, is formed on the anode 31 of the second region $S_2$.

Subsequently, a dry etching mask 28 is formed in a predetermined region on this passivation film 25 (FIG. 7(*b*)). The dry etching mask 28 is formed in the same way as in the above-described first embodiment, so as to cover the first region $S_1$ and a peripheral part except a region in the second region $S_2$ for forming a light-emitting element 30.

After that, dry etching is performed using the dry etching mask 28 as a protective film to remove the bank precursor layer 39 in regions not covered with the dry etching mask 28 (FIG. 7(*c*)). This dry etching is performed until the anode 31 formed in the second region $S_2$ is exposed. Consequently, the bank precursor layer 39 formed on the anode 31 and composed of a laminated structure is removed. Thus, there is formed a region for forming the light-emitting element 30 in the second region $S_2$. There is also formed a bank part 36 out of the bank precursor layer 39 of a peripheral part that remained after etching. As a result, an organic thin-film transistor 50 and the bank part 36 are formed on the substrate 1, and an organic thin-film transistor substrate 42 having a region for forming the light-emitting element 30 is obtained.

In this organic thin-film transistor substrate 42, the bank part 36 has a four-layer structure composed of the organic semiconductor layer 23, the gate insulation layer 22, the passivation film 25 and the dry etching mask 28. That is, the bank part 36 includes the same four layers included in the organic thin-film transistor 50. The bank part 36 having such a structure as described above can exhibit excellent insulation properties like the bank part in the above-described first embodiment and, therefore, has characteristics adequate for a bank.

Figure 8:
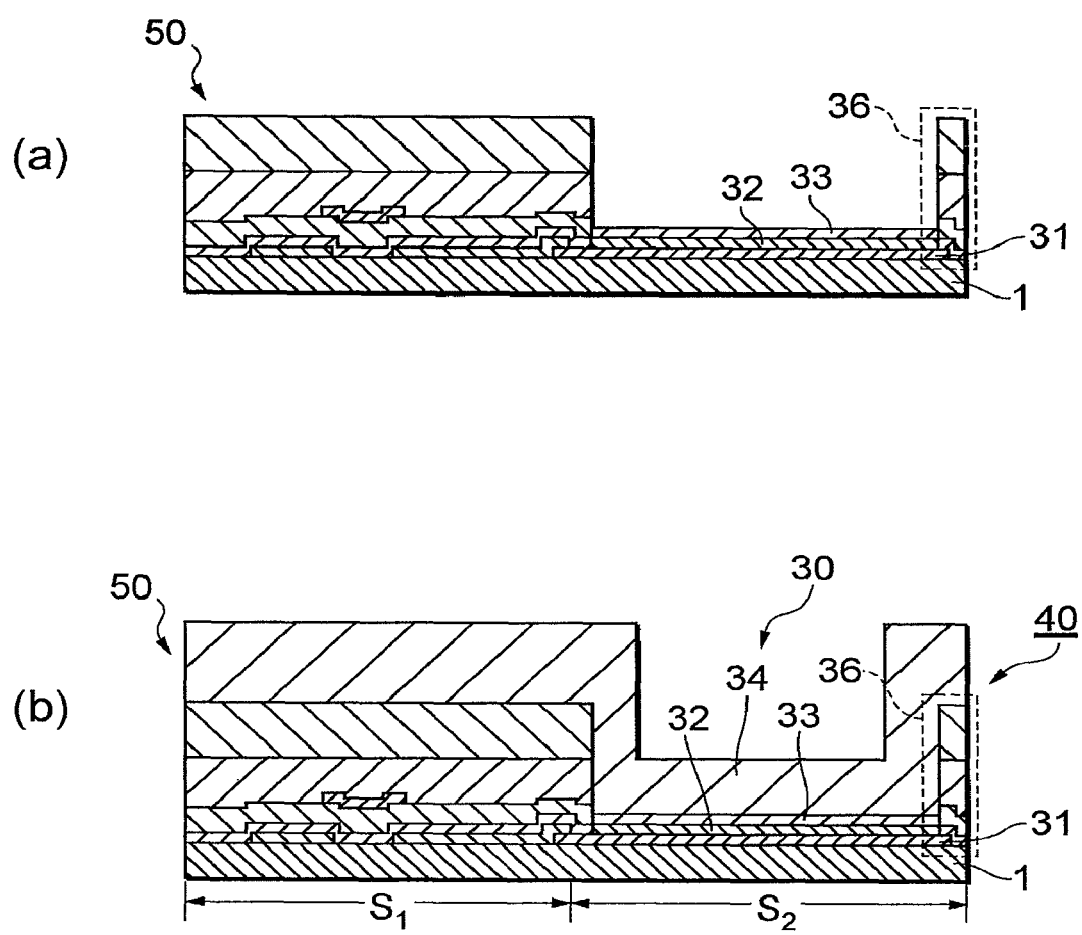
FIG. 8 is still another diagram illustrating manufacturing steps of the image display panel in accordance with the second embodiment.

After the organic thin-film transistor substrate 42 is formed, a hole-injection layer 32 (FIG. 7(*d*)) and a light-emitting layer 33 (FIG. 8(*a*)) are formed in this order on the anode 31 in the second region $S_2$ of the substrate 42. Then, a cathode 34 is formed so as to cover the entire area of the first region $S_1$ and the second region $S_2$ (FIG. 8(*b*)). Consequently, in the second region S₂, there is formed the light-emitting element 30 provided with the anode 31, the hole-injection layer 32, the light-emitting layer 33 and the cathode 34 in the order from the substrate 1 side. As a result, the organic thin-film transistor 50 is formed in the first region S₁ on the substrate 1, and there is obtained an image display panel 40 in which the light-emitting element 30 surrounded by the bank part 36 is formed in the second region S₂. Such an image display panel 40 as described above is also preferably sealed in the same way as the image display panel 10 in the first embodiment, so that respective elements are covered.

Respective steps in a method for manufacturing the image display panel 40 of the above-described second embodiment can also be changed within the scope of the present invention, as in the above-described first embodiment. For example, the source electrode 24*a* and the drain electrode 24*b* may be formed earlier than the anode 31. Alternatively, if these electrodes are made of the same material, the electrodes may be formed in the same step. Still alternatively, the passivation film 25 may be made of a material capable of photolithography, such as a photosensitive acrylic resin, so as to also serve the functions of the dry etching mask 28.

A description has been made heretofore of preferred methods for manufacturing an image display panel (organic thin-film transistor substrate) of the present invention by taking as examples the first and second embodiments. According to such manufacturing methods as described above, it is possible to not only manufacture an organic thin-film transistor but also form a bank part. Accordingly, it is possible to form an image display panel and an organic thin-film transistor substrate in a simplified manner and at low costs, compared with a case in which the bank part is formed separately as has been done conventionally. The bank part formed in this way has adequate insulation properties and, therefore, has characteristics adequate for a bank. In addition, the bank part as a whole, if made of a plurality of layers as in the above-described embodiments, can maintain adequate insulation properties and the like even if pinholes are formed in some layers or foreign matter is mixed with some layers. Thus, the bank part can have the advantageous effect that it also has excellent durability.

Note that a method for manufacturing an image display panel and an organic thin-film transistor substrate of the present invention is not limited to the above-described first and second embodiments, but may be modified as appropriate without departing from the subject matter of the present invention. For example, although in the above-described embodiments, the organic EL element is formed as the light-emitting element, the present invention is not limited to this. Alternatively, it is possible to apply, without any particular limitation, other light-emitting elements to be used along with the organic thin-film transistor. Furthermore, although an explanation has been made in the above-described embodiments by taking as examples the bottom-gate and top-gate organic thin-film transistors, an organic thin-film transistor having a structural form other than these structural forms may alternatively be applied.

Still furthermore, in the above-described embodiments, an explanation has been made of manufacturing steps with respect to one pixel region in the image display panel. Under normal conditions, however, the image display panel is constructed by arranging a multitude of pixels. Accordingly, in the actual manufacture of the image display panel, the above-described steps in one pixel region may be carried out concurrently in a plurality of places on the substrate. For this purpose, steps for providing a specific construction among pixels, such as connecting pixels to one another, may further be carried out in some cases in the manufacture of the image display panel, in addition to the steps in the above-described embodiments.

The invention claimed is:

1. An organic thin-film transistor substrate, wherein an organic thin-film transistor is formed in a first region on a substrate, a second region for forming a light-emitting element in abutment with the first region is included, and a bank part is formed in a peripheral part of the second region,
    characterized in that the organic thin-film transistor is provided at least with a gate electrode, a gate insulation layer, a source electrode and a drain electrode formed on a side of the gate insulation layer opposite to the gate electrode, and an organic semiconductor layer formed on a side of the gate insulation layer opposite to the gate electrode and having contact with both the source electrode and the drain electrode, and the bank part includes a layer made of the same material as the material of at least one of the gate insulation layer and the organic semiconductor layer.

2. The organic thin-film transistor substrate according to claim 1, characterized by including both a layer made of the same material as the material of the gate insulation layer and a layer made of the same material as the material of the organic semiconductor layer.

3. The organic thin-film transistor substrate according to claim 1, characterized in that a lower electrode for the light-emitting element is formed in the second region on the substrate.

4. An image display panel comprising a substrate; an organic thin-film transistor formed in a first region on the substrate; a light-emitting element formed in a second region adjacent to the first region on the substrate; and a bank part formed in a peripheral part of the second region on the substrate so as to surround the light-emitting element;
    characterized in that the organic thin-film transistor is provided at least with a gate electrode, a gate insulation layer, a source electrode and a drain electrode formed on a side of the gate insulation layer opposite to the gate electrode, and an organic semiconductor layer formed on a side of the gate insulation layer opposite to the gate electrode and having contact with both the source electrode and the drain electrode, and the bank part includes a layer made of the same material as the material of at least one of the gate insulation layer and the organic semiconductor layer.

* * * * *